(12) United States Patent
Ryu et al.

(10) Patent No.: US 12,620,440 B2
(45) Date of Patent: May 5, 2026

(54) STORAGE DEVICE AND METHOD OF OPERATING THE SAME

(71) Applicant: SK hynix Inc., Gyeonggi-do (KR)

(72) Inventors: Seung Han Ryu, Gyeonggi-do (KR); Sung Geun Kang, Gyeonggi-do (KR); Hyeong Rak Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 292 days.

(21) Appl. No.: 18/448,164

(22) Filed: Aug. 11, 2023

(65) Prior Publication Data

US 2024/0282375 A1 Aug. 22, 2024

(30) Foreign Application Priority Data

Feb. 20, 2023 (KR) ........................ 10-2023-0022287

(51) Int. Cl.
*G11C 16/04* (2006.01)
*G06F 3/06* (2006.01)
*G11C 14/00* (2006.01)

(52) U.S. Cl.
CPC ........ *G11C 14/0018* (2013.01); *G06F 3/0619* (2013.01); *G06F 3/065* (2013.01); *G06F 3/0658* (2013.01); *G06F 3/0679* (2013.01)

(58) Field of Classification Search
CPC ...... G06F 3/0619; G06F 3/065; G06F 3/0658; G06F 3/0679; G11C 14/0018
See application file for complete search history.

(56) References Cited

U.S. PATENT DOCUMENTS

2011/0055625 A1* 3/2011 Honda .................. G06F 11/141
 711/E12.001
2015/0103599 A1* 4/2015 Kim .................... G11C 11/5628
 365/185.12
2017/0062040 A1* 3/2017 Cho ...................... G06F 1/3287
2020/0089410 A1* 3/2020 Park ........................ G06F 3/064

FOREIGN PATENT DOCUMENTS

KR 10-2009-0129624 A 12/2009
KR 10-2014-0051685 A 5/2014
KR 10-2021-0048349 A 5/2021
KR 10-2021-0080967 A 7/2021

* cited by examiner

*Primary Examiner* — Pho M Luu
(74) *Attorney, Agent, or Firm* — IP & T GROUP LLP

(57) ABSTRACT

A storage device includes a nonvolatile storage area including a plurality of backup memory blocks each including a plurality of memory cells respectively connected to a plurality of word lines, and a controller configured to control the nonvolatile storage area to determine a target memory block in which data is to be stored among the plurality of backup memory blocks, determine a reference word line among the plurality of word lines coupled to the target memory block, and perform a pre-conditioning operation of programming dummy data to memory cells connected to at least one of remaining word lines except for the reference word line among the plurality of word lines coupled to the target memory block.

18 Claims, 12 Drawing Sheets

BACKUP MEMORY BLOCK 1 → TARGET BLOCK AT FIRST POWER CYCLE
TARGET BLOCK AT (K+1)-TH POWER CYCLE

SUDDEN POWER OFF

BACKUP MEMORY BLOCK 2 → TARGET BLOCK AT SECOND POWER CYCLE

SUDDEN POWER OFF

BACKUP MEMORY BLOCK 3 → TARGET BLOCK AT THIRD POWER CYCLE

BACKUP MEMORY BLOCK k → TARGET BLOCK AT K-TH POWER CYCLE

| DUMMY DATA INFORMATION |
| :--- |

| DUMMY DATA |
| :--- |

1 Page

| ADDRESS INFORMATION |
| :--- |

| BACKUP BLK ADD INFORMATION | REFERENCE WL INFORMATION |
| :--- | :--- |

REF WL N

DUMP

DUMMY PAGE

STORAGE DEVICE AND METHOD OF OPERATING THE SAME

CROSS-REFERENCE TO RELATED APPLICATION

The present application claims priority under 35 U.S.C. § 119(a) to Korean patent application number 10-2023-0022287 filed on Feb. 20, 2023, the entire disclosure of which is incorporated by reference herein.

BACKGROUND

1. Field of Invention

Embodiments of the present disclosure relate to an electronic device, and more particularly, to a storage device and a method of operating the same.

2. Description of Related Art

A storage device is a device that stores data under control of a host device such as a computer or a smartphone. A storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

When power input to the storage device is cut off, the memory controller is required to store data stored in the volatile memory device in the nonvolatile memory device. Additionally, when the power input to the storage device is cut off, the memory controller is required to store data in the nonvolatile memory device using limited auxiliary power. Therefore, when the power required in a process of storing data in the nonvolatile memory device is reduced, a capacity of the auxiliary power required for the storage device may be reduced.

SUMMARY

An embodiment of the present disclosure provides a storage device and a method of operating the same capable of performing a stable dump operation.

According to an embodiment of the present disclosure, a storage device includes a nonvolatile storage area including a plurality of backup memory blocks each including a plurality of memory cells respectively connected to a plurality of word lines, and a controller configured to control the nonvolatile storage area to determine a target memory block in which data is to be stored among the plurality of backup memory blocks, determine a reference word line among the plurality of word lines coupled to the target memory block, and perform a pre-conditioning operation of programming dummy data to memory cells connected to at least one of remaining word lines except for the reference word line among the plurality of word lines coupled to the target memory block.

According to an embodiment of the present disclosure, a storage device includes a nonvolatile backup memory block including memory cells connected to each of a plurality of word lines, and a controller configured to perform, in response to a sudden power off, a dump operation on the memory cells connected to one of first and second word line groups divided with reference to a reference word line requiring lowest power to program data to the memory cells coupled thereto, among the plurality of word lines.

According to an embodiment of the present disclosure, a method of operating a controller includes receiving pre-condition information, determining, based on the pre-condition information, a target memory block on which a dump operation is to be performed, performing a pre-conditioning operation on memory cells connected to word lines included between a source select line and a reference word line among word lines coupled to the target memory block, and performing, in response to a sudden power off, the dump operation on memory cells connected to word lines included between a drain select line and the reference word line among the word lines coupled to the target memory block.

According to an embodiment of the present disclosure, a storage device includes rows of non-volatile memory cells, the rows being classified into first and second groups with reference to a selected one of the rows; and a controller configured to perform a pre-conditioning operation on one or more rows within the first group, and to perform a dump operation on the second group when a power supply of the storage device is interrupted.

The storage device according to the present technology may perform a stable dump operation.

BRIEF DESCRIPTION OF THE DRAWINGS

FIG. 5 is a diagram illustrating a structure of a memory block according to an embodiment of the present disclosure.

FIG. 7 is a diagram illustrating pre-condition information according to an embodiment of the present disclosure.

FIG. 8 is a diagram illustrating a pre-conditioning operation and a dump operation according to an embodiment of the present disclosure.

FIG. 9 is a diagram illustrating a pre-conditioning operation and a dump operation according to another embodiment of the present disclosure.

FIG. 12 is a diagram illustrating a user system to which a storage device according to an embodiment of the present disclosure is applied.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
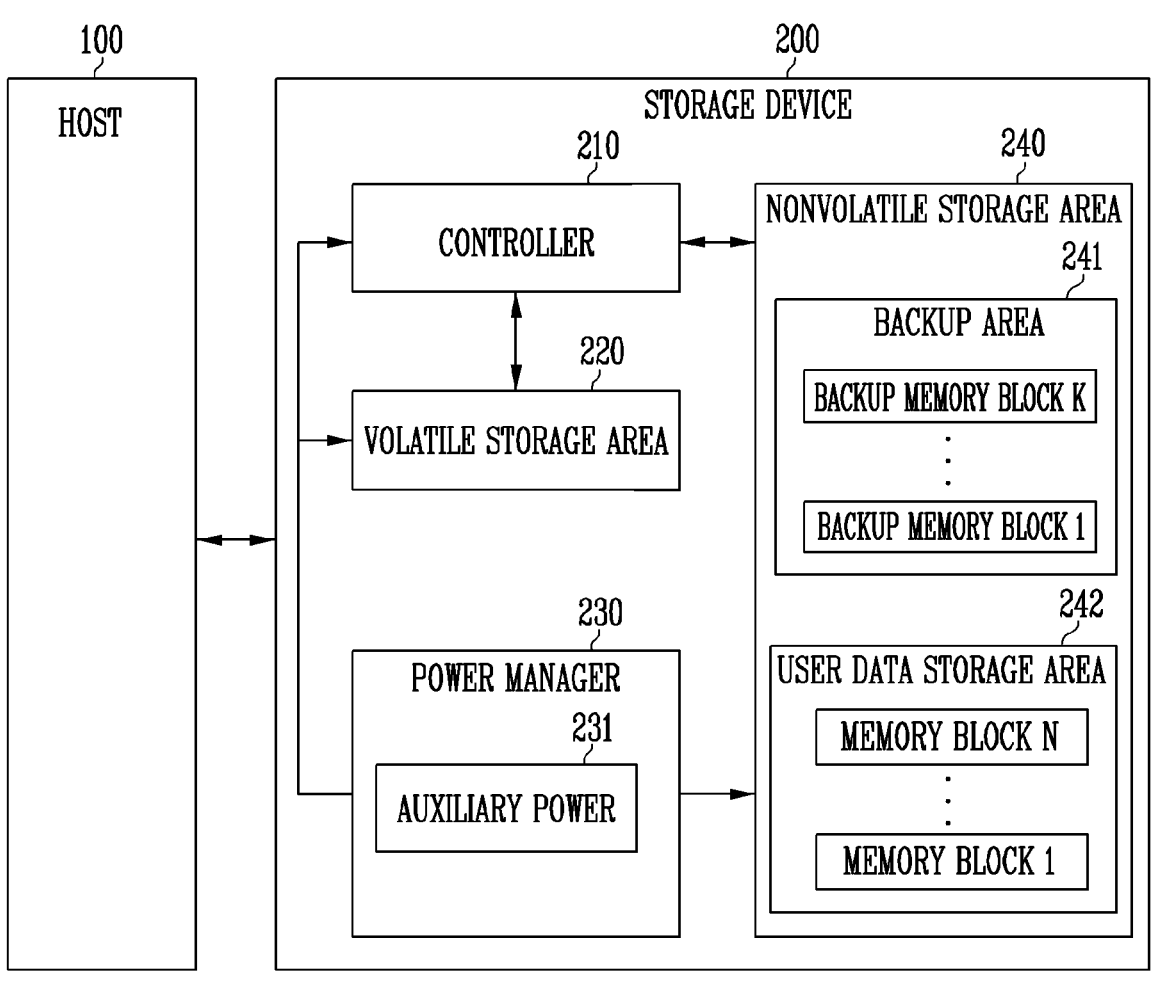
FIG. 1 is a diagram illustrating a storage device according to an embodiment of the present disclosure.

FIG. 1 is a diagram illustrating a storage device 200 according to an embodiment of the present disclosure.

The storage device 200 may include a controller 210, a volatile storage area 220, a power manager 230 and a nonvolatile storage area 240.

The storage device 200 may be connected to a host 100. The host 100 may include a mobile phone, a smart phone, a laptop computer, a desktop computer, a TV, a game console, a tablet PC, an in-vehicle infotainment system, a drone, an autonomous vehicle, and the like. The host 100 may control the storage device 200 to store data in the nonvolatile storage area 240.

The storage device 200 may be manufactured as any of various types of storage devices according to a host interface that is a communication method with the host 100. For example, the storage device 200 may be configured as any of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 200 may be manufactured as any of various types of packages. For example, the storage device 200 may be manufactured as any of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The volatile storage area 220 may temporarily store data received from the host 100 or data received from the nonvolatile storage area 240, or may temporarily store meta data (for example, a mapping table) of the nonvolatile storage area 240. The volatile storage area 220 may include a volatile memory such as a DRAM, an SDRAM, a DDR SDRAM, an LPDDR SDRAM, and a GRAM, or nonvolatile memories such as an FRAM, a ReRAM, an STT-MRAM, and a PRAM.

The nonvolatile storage area 240 may store data. The nonvolatile storage area 240 operates in response to control of the controller 210. The nonvolatile storage area 240 may include a memory cell array including a plurality of memory cells that store data. The memory cell array may include a plurality of memory blocks. Each of the memory blocks may include a plurality of memory cells. One memory block may include a plurality of pages.

In an embodiment, a page may be a unit for programming data to the nonvolatile storage area 240 or reading data stored in the nonvolatile storage area 240. A memory block may be a unit for erasing data stored in the nonvolatile storage area 240.

In an embodiment, the nonvolatile storage area 240 may be configured of a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM). In the present specification, for convenience of description, the nonvolatile storage area 240 is a NAND flash memory.

In an embodiment, the nonvolatile storage area 240 may include a backup area 241 and a user data storage area 242. The backup area 241 may include a plurality of backup memory blocks. The user data area 242 may include a plurality of memory blocks.

In an embodiment, each of the memory cells included in the backup area 241 may be configured as a single level cell (SLC) storing one data bit.

In an embodiment, each memory cell included in the user data storage area 242 may be configured as a multi-level cell (MLC) storing two data bits, a triple-level cell (TLC) storing three data bits, or a quad level cell (QLC) storing four data bits.

However, the present disclosure is not limited to such an embodiment. For example, each of the memory cells included in the backup area 241 may also be configured as an MLC, a TLC, or a QLC.

The controller 210 may control overall operations of the storage device 200.

The controller 210 may control the nonvolatile storage area 240 to perform a program operation, a read operation, or an erase operation according to a request of the host 100. During the program operation, the controller 210 may provide a program command CMD_PROG and data to the nonvolatile storage area 240. During the read operation, the controller 210 may provide a read command CMD_RD to the nonvolatile storage area 240. During the erase operation, the controller 210 may provide an erase command CMD_ERASE to the nonvolatile storage area 240.

The nonvolatile storage area 240 is configured to receive a command and an address from the controller 210 and access an area selected by the address in the memory cell array. That is, the nonvolatile storage area 240 may perform an operation corresponding to the command with respect to the area selected by the address. For example, the nonvolatile storage area 240 may perform the program operation (write operation), the read operation, and the erase operation. During the program operation, the nonvolatile storage area 240 may program data to the area selected by the address. During the read operation, the nonvolatile storage area 240 may read data from the area selected by the address. During the erase operation, the nonvolatile storage area 240 may erase data stored in the area selected by the address.

When power is applied to the storage device 200, the controller 210 may execute firmware (FW). When the nonvolatile storage area 240 is configured of a flash memory device, the controller 210 may execute a firmware such as a flash translation layer (FTL) for controlling communication between the host 100 and the nonvolatile storage area 240. When power is applied to the storage device 200, the controller 210 may read data required for booting the storage device 200 from a ROM (not shown).

In an embodiment, the controller 210 may receive data and a logical address (LA) from the host 100, and may convert the LA into a physical address (PA) indicating an address of memory cells in which data included in the nonvolatile storage area 240 is to be stored. In addition, the controller 210 may store a logical-physical address mapping table configuring a mapping relationship between the LA and the PA in the volatile storage area 220.

The controller 210 may communicate with the host 100. In an embodiment, the controller 210 may communicate with the host 100 using at least one of various communication standards or interfaces such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

The storage device 200 may include the power manager 230. The power manager 230 may be configured of a power management integrated circuit (PMIC) and the like integrated into one chip. The power manager 230 may supply power required for driving the storage device 200 based on power applied from an external device.

The power manager 230 may include an auxiliary power supply 231. The auxiliary power supply 231 may be charged by power received by the power manager 230. The auxiliary power supply 231 may include a tantalum polymer solid capacitor (POSCAP). The auxiliary power supply 231 may supply power to the controller 210, the volatile storage area 220, and the nonvolatile storage area 240 in response to a sudden power off (SPO), in which the power is suddenly cut off to the storage device 200.

The host 400 may communicate with the storage device 200 using at least one of various communication standards or interfaces such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), a load reduced DIMM (LRDIMM), and an I2C communication using an SM-BUS.

Figure 2:
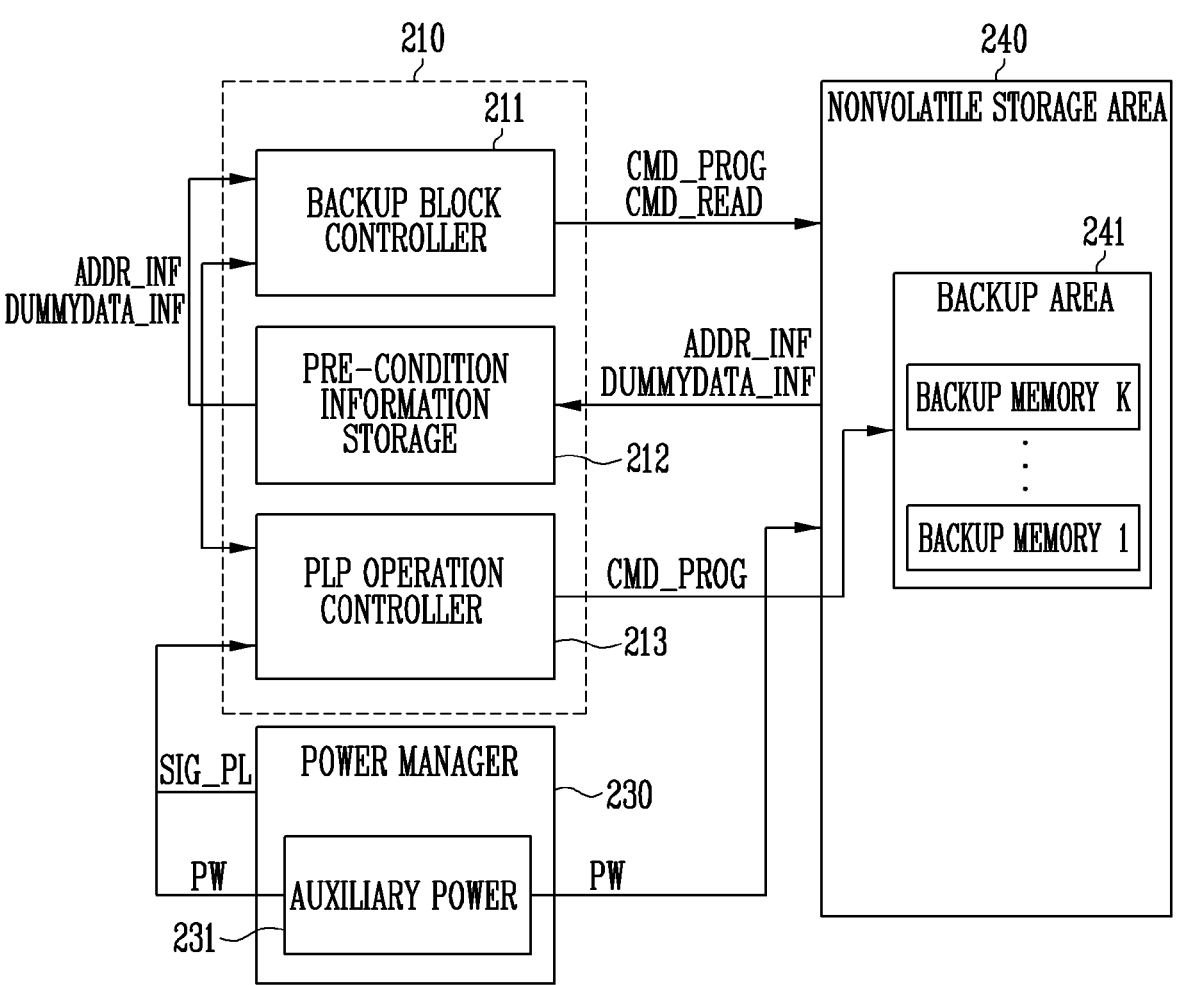
FIG. 2 is a detailed diagram for describing an operation of a controller according to an embodiment of the present disclosure.

FIG. 2 is a detailed diagram for describing an operation of a controller according to an embodiment of the present disclosure.

Referring to FIG. 2, the controller 210 may include a backup block controller 211, a pre-condition information storage 212, and a power loss protection (PLP) operation controller 213.

The backup block controller 211 may control overall operations of backup memory blocks included in the backup area 241.

The backup block controller 211 may control the nonvolatile storage area 240 to read pre-condition information therefrom. The backup block controller 211 may provide a read command CMD_READ to the nonvolatile storage area 240 to read, from the nonvolatile storage area 240, the pre-condition information, which is information required for performing a pre-conditioning operation. The read pre-condition information may be temporarily stored in the pre-condition information storage 212.

The backup block controller 211 may control the nonvolatile storage area 240 to perform the pre-conditioning operation on a target memory block among the plurality of backup memory blocks. More specifically, the backup block controller 211 may perform the pre-conditioning operation on memory cells included in a selected backup memory block, i.e., the target memory block among the plurality of backup memory blocks included in the backup area 241 included in the nonvolatile storage area 240. The pre-conditioning operation may be an operation of programming dummy data to memory cells connected to at least one word line among word lines except for a reference word line among word lines coupled to the target memory block.

The backup block controller 211 may determine the target memory block among the plurality of backup memory blocks included in the backup area 241. The target memory block may be a memory block, into which data will be dumped from the volatile storage area 220 in response to a sudden power off. The target memory block may be changed whenever power of the storage device 200 shown in FIG. 1 is turned on.

The backup block controller 211 may determine a pre-conditioning operation mode between first and second operation modes. In the first operation mode, the dummy data may be programmed to memory cells connected to all word lines positioned below the reference word line. In an embodiment, the word lines positioned below the reference word line may be word lines included between a source select line and the reference word line. In the second operation mode, the dummy data may be programmed to memory cells connected to one word line positioned below the reference word line among word lines adjacent to the reference word line. In an embodiment, the one word line positioned below the reference word line may be word line close to the source select line among the word lines adjacent to the reference word line.

However, the present disclosure is not limited to such an embodiment. In an embodiment, in the first operation mode, the dummy data may be programmed to memory cells connected to all word lines positioned above the reference word line. In an embodiment, the word lines positioned above the reference word line may be word lines included between a drain select line and the reference word line. In an embodiment, in the second operation mode, the dummy data may be programmed to memory cells connected to one word line positioned above the reference word line among the word lines adjacent to the reference word line. In an embodiment, the one word line positioned above the reference word line may be word line close to the drain select line among the word lines adjacent to the reference word line.

The backup block controller 211 may perform the pre-conditioning operation based on the pre-condition information stored in the pre-condition information storage 212. The pre-condition information may include address information and dummy data information. A detailed description of the pre-condition information is described later with reference to FIG. 7.

In an embodiment, the backup block controller 211 may determine the target memory block based on the pre-condition information provided by the pre-condition information storage 212, determine the reference word line of the target memory block, and determine the dummy data to be stored into the memory cells coupled to one or more selected word lines with reference to the reference word line among the word lines coupled to the target memory block.

After the pre-conditioning operation is completed, the backup block controller 211 may provide the PLP operation controller 213 with address information of the target memory block and information on word lines to which data is to be dumped.

The PLP operation controller 213 may perform a PLP dump operation in response to the SPO. The dump operation may be an operation of storing or dumping data from the volatile storage area 220 into a target memory block selected from among a plurality of backup memory blocks within the backup area 241. The PLP operation controller 213 may provide the program command CMD_PROG to the non-volatile storage area 240 to perform a PLP dump operation in response to a power loss signal SIG_PL provided by the power manager 230 in response to the SPO.

The PLP operation controller 213 may receive address information and reference word line information of the target memory block from the backup block controller 211 and control the nonvolatile storage area 240 to perform the dump operation on remaining word lines except for the word lines on which the pre-conditioning operation is performed.

In an embodiment, the PLP operation controller 213 may control the nonvolatile storage area 240 to perform the dump operation on memory cells connected to one of first and second word line groups, which are classified with reference to the reference word line.

When power is applied to the storage device 200 after the dump operation is performed, the backup block controller 211 may perform a recovery operation. The recovery operation may be an operation of again performing an operation interrupted by the SPO.

In an embodiment, the backup block controller 211 may perform the recovery operation based on data stored in memory cells on which the dump operation is performed. For example, the backup block controller 211 may control the nonvolatile storage area 240 to store data, which is stored in the memory cells on which the dump operation is performed, in the user data storage area 242 shown in FIG. 1.

After performing the recovery operation, the backup block controller 211 may control the nonvolatile storage area 240 to perform an erase operation on the target memory block.

The power manager 230 may overall control power applied to the storage device.

The power manager 230 may supply, to the storage device, power applied from an external device. The power manager 230 may supply the power to the controller 210, the volatile storage area 220, and the nonvolatile storage area 240.

The power manager 230 may include the auxiliary power supply 231. By the power manager 230, the auxiliary power supply 231 may be charged with the power applied from the outside. A capacity of the auxiliary power supply 231 may vary according to design.

The power manager 230 may provide the power loss signal SIG_PL to the PLP operation controller 213 when the SPO occurs.

Figure 3:
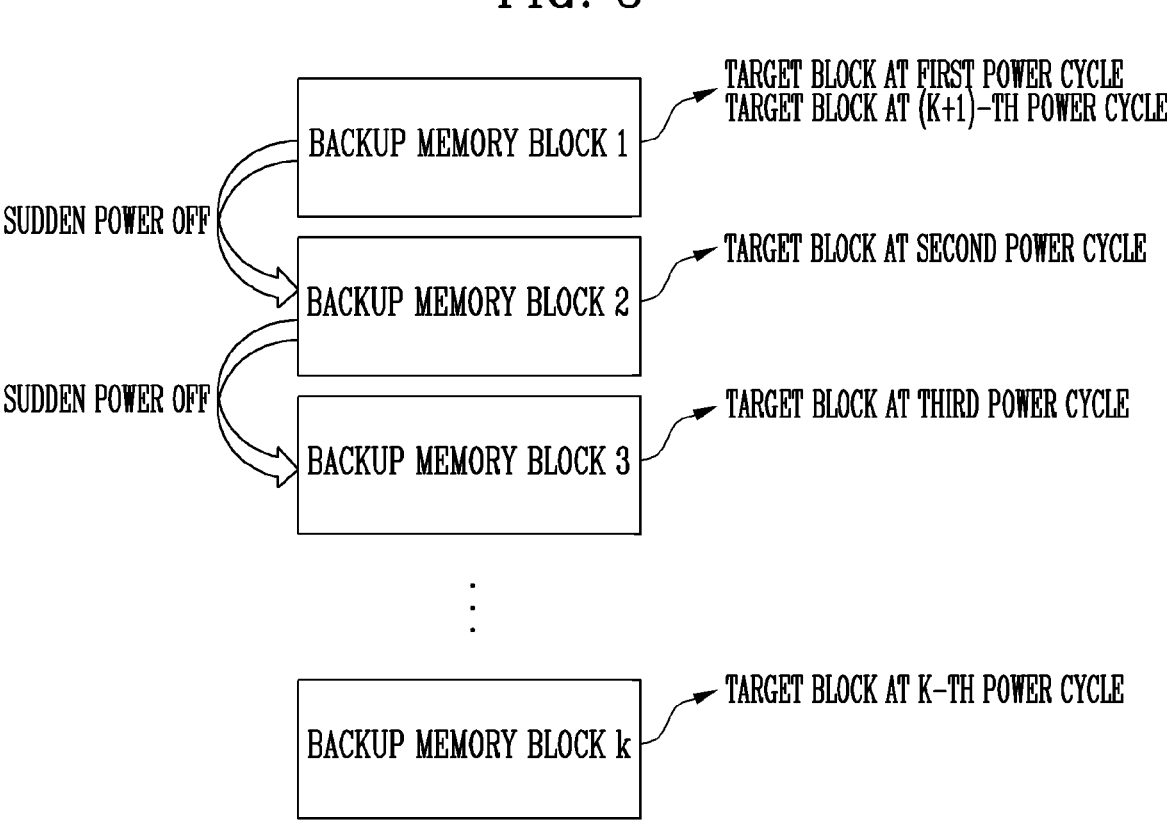
FIG. 3 is a diagram illustrating a target memory block determined according to an embodiment of the present disclosure.

FIG. 3 is a diagram illustrating a target memory block determined according to an embodiment of the present disclosure.

Referring to FIG. 3, the target memory block may be changed every power cycle of the storage device. The target memory blocks may be determined in an order of addresses of the plurality of backup memory blocks whenever power of the storage device 200 is turned on.

The backup area 241 shown in FIG. 1 may include the plurality of backup memory blocks. The backup memory blocks may be memory blocks, into which data is to be dumped from the volatile storage area 220 in response to the SPO.

The backup block controller 211 shown in FIG. 2 may determine the target memory block from among the plurality of backup memory blocks at each power cycle of the storage device 200. For example, the backup block controller 211 may determine a backup memory block 1 as the target memory block from among the plurality of backup memory blocks 1 to k when the power is applied to the storage device in a first power cycle. In an embodiment, a single target memory block may be determined from among the plurality of backup memory blocks 1 to k.

Referring to FIG. 3, the SPO may occur in a state in which the backup memory block 1 is determined as the target memory block. When the SPO occurs, the PLP operation controller 213 shown in FIG. 2 may perform the dump operation with the backup memory block 1.

In an embodiment, after the SPO occurs, the power may be applied to the storage device 200. Since the power of the storage device is turned off and then turned on, another power cycle or a second power cycle may begin. The backup block controller 211 may determine a backup memory block 2 as the target memory block from among the plurality of backup memory blocks 1 to k in the second power cycle.

The backup block controller 211 may perform the recovery operation based on the data stored in the backup memory block. The recovery operation may be an operation of again performing an operation interrupted by the SPO based on the data stored in the backup memory block.

In an embodiment, the backup block controller 211 may resume the interrupted program operation based on the data stored in the backup memory block 1. The backup block controller 211 may store the data, which is stored in the backup memory block 1, in the user data storage area 242 shown in FIG. 1.

After performing the recovery operation, the backup block controller 211 may provide an erase command to perform an erase operation on the backup memory block 1.

In an embodiment, the SPO may occur in a state in which the backup memory block 2 is determined as the target memory block. When the SPO occurs, the PLP operation controller 213 shown in FIG. 2 may perform the dump operation with the backup memory block 2 determined as the target memory block to preserve the data stored in the volatile storage area.

In an embodiment, after the SPO occurs, the power may be applied to the storage device 200. Since the power of the storage device is turned off and then turned on, still another power cycle or a third power cycle may begin. The backup block controller 211 may determine a backup memory block 3 as the target memory block from among the plurality of backup memory blocks 1 to k in the third power cycle.

The backup block controller 211 may perform the recovery operation based on the data stored in the backup memory block. The recovery operation may be an operation of again performing an operation interrupted by the SPO based on the data stored in the backup memory block.

In an embodiment, the backup block controller 211 may resume the interrupted program operation based on the data stored in the backup memory block 2. The backup block controller 211 may store the data, which is stored in the backup memory block 2, in the user data storage area 242 shown in FIG. 1.

After performing the recovery operation, the backup block controller 211 may provide an erase command to perform an erase operation on the backup memory block 2.

In an embodiment, the backup block controller 211 may again determine the backup memory block 1 as the target memory block when another power cycle begins in a state in which a backup memory block k, i.e., the last one, is determined as the target memory block from among the plurality of backup memory blocks 1 to k.

Figure 4:
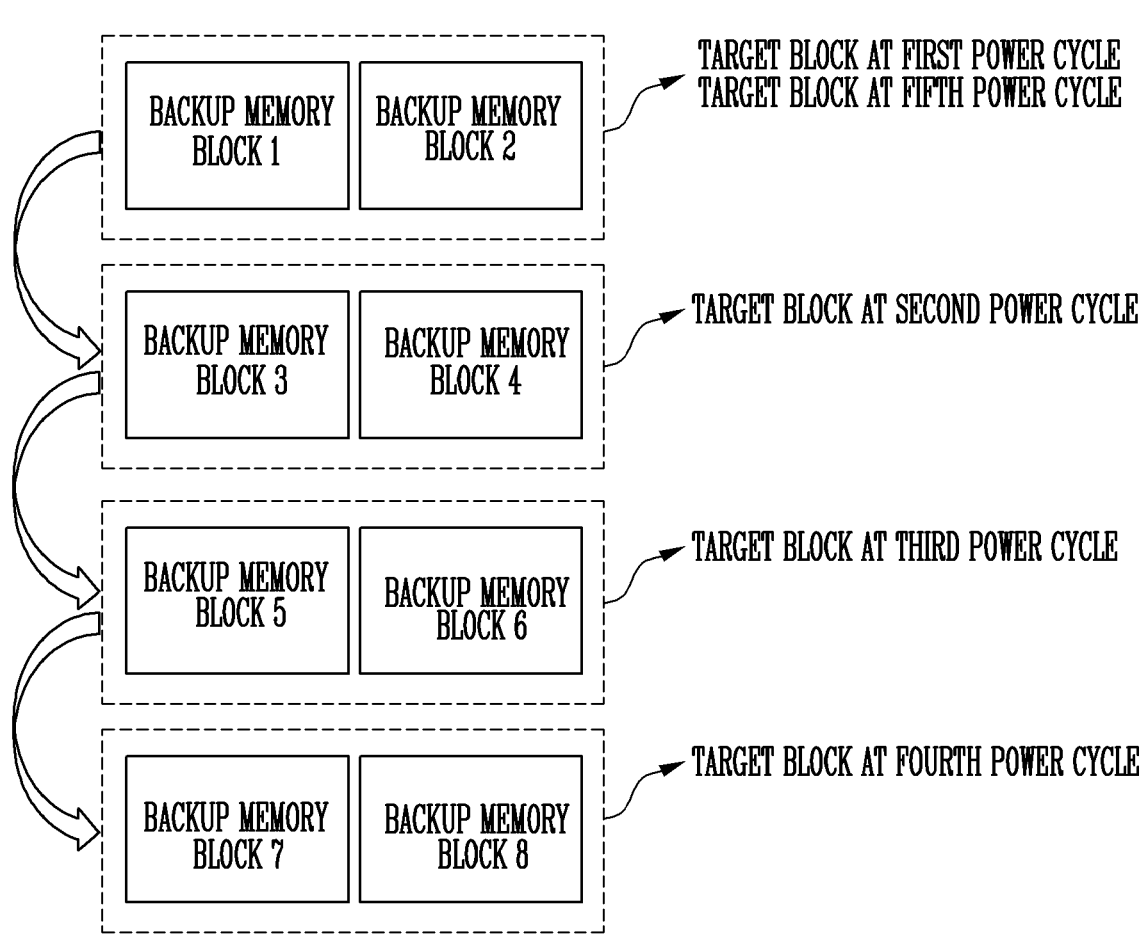
FIG. 4 is a diagram illustrating a target memory block determined according to another embodiment of the present disclosure.

FIG. 4 is a diagram illustrating a target memory block determined according to another embodiment of the present disclosure.

Referring to FIG. 4, a plurality of target memory blocks may be set.

As described above in the description of FIG. 3, the backup block controller 211 shown in FIG. 2 may determine the target memory block from among the plurality of backup memory blocks at each power cycle of the storage device 200. For example, the backup block controller 211 may determine the backup memory block 1 and the backup memory block 2 as the target memory blocks from among the plurality of backup memory blocks 1 to 8 when the power is applied to the storage device in the first power cycle. In an embodiment, two target memory blocks may be determined from among the plurality of backup memory blocks 1 to 8.

In an embodiment, the SPO may occur in a state in which the backup memory block 1 and the backup memory block 2 are determined as the target memory blocks. When the SPO occurs, the PLP operation controller 213 shown in FIG. 2 may perform the dump operation with the backup memory blocks 1 and 2.

In an embodiment, after the SPO occurs, the power may be applied to the storage device 200. Since the power of the storage device is turned off and then turned on, another power cycle or the second power cycle may begin. The backup block controller 211 may determine the backup memory block 3 and backup memory block 4 as the target memory blocks from among the plurality of backup memory blocks 1 to 8 in the second power cycle.

In the description of FIG. 3, content overlapping the above-described content is omitted.

Figure 5:
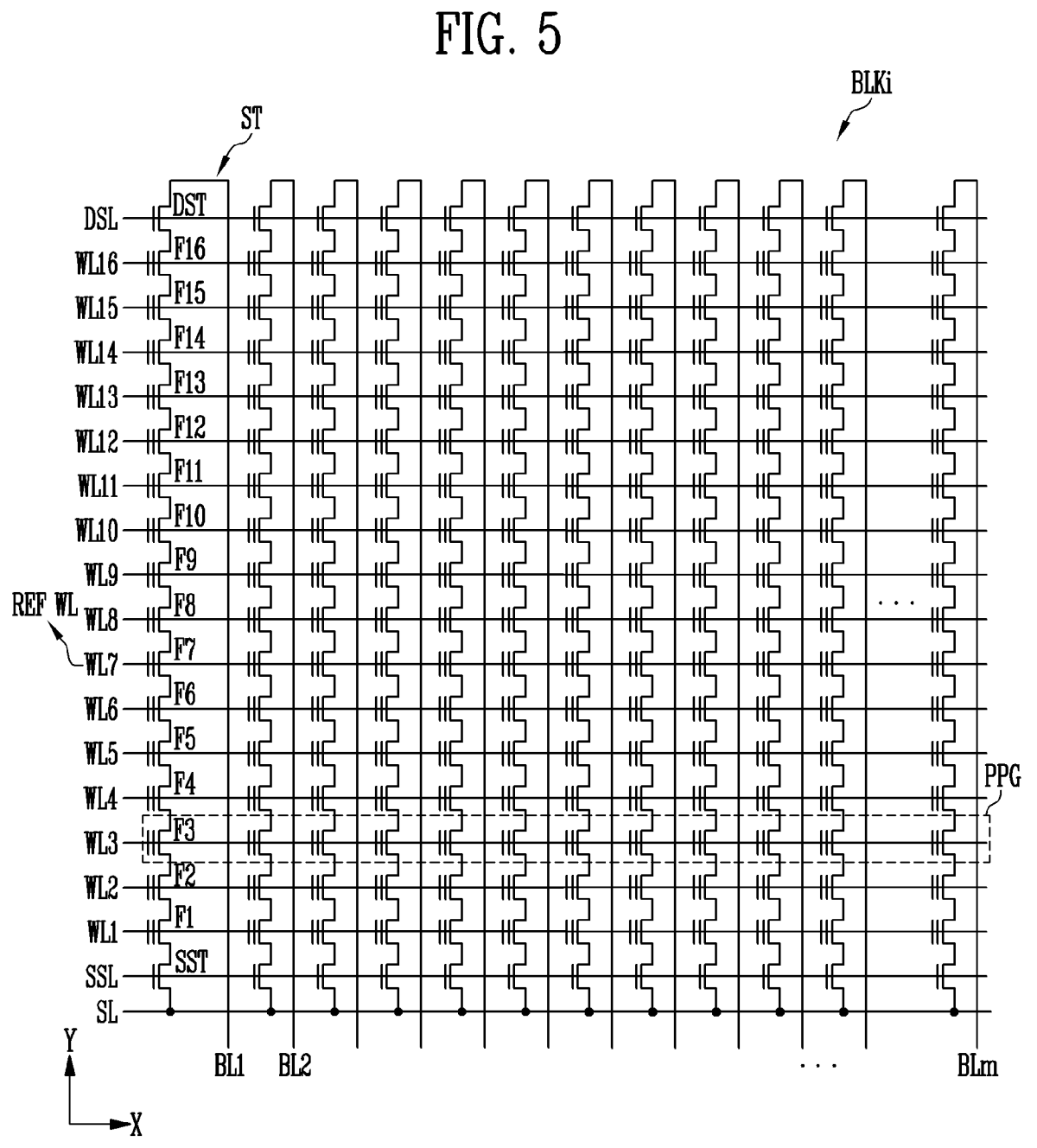

FIG. 5 is a diagram illustrating a structure of a memory block according to an embodiment of the present disclosure.

Referring to FIG. 5, in the memory block BLKi, a plurality of word lines arranged in parallel with each other may be connected between a first select line and a second select line. Here, the first select line may be a source select line SSL, and the second select line may be a drain select line DSL. More specifically, the memory block BLKi may include a plurality of strings ST connected between bit lines BL1 to BLm and a source line SL. The bit lines BL1 to BLm may be connected to the strings ST, respectively, and the source line SL may be commonly connected to the strings ST. Since the strings ST may be configured to be identical to each other, a string ST connected to the first bit line BL1 is specifically described as an example.

The string ST may include a source select transistor SST, a plurality of memory cells F1 to F16, and a drain select transistor DST connected in series between the source line SL and the first bit line BL1. One string ST may include at least one of the source select transistor SST and the drain select transistor DST, and may include more than the number of memory cells F1 to F16 shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a physical page PPG. Therefore, the memory block BLKi may include a number of physical pages PPG which corresponds to the number of the word lines WL1 to WL16.

The SLC may store one bit of data. One physical page PPG of the SLC may store one logical page (LPG) data. One logical page (LPG) data may include data bits corresponding to the number of cells included in one physical page PPG.

The MLC, the TLC, and the QLC may store two or more bits of data. In this case, one physical page PPG may store two or more logical page (LPG) data.

In an embodiment, the memory block BLKi shown in FIG. 5 is the target memory block and a seventh word line WL7 is the reference word line REF WL of the target memory block. The word lines WL1 to WL16 coupled to the memory block shown in FIG. 3 may be divided into a first word line group WL1 to WL6 and a second word line group WL8 to WL16 based on the reference word line WL7. The PLP operation controller 213 shown in FIG. 2 may control the nonvolatile storage area to dump data to memory cells connected to any word line group among a plurality of word line groups divided based on the reference word line.

In an embodiment, data may be programmed in an order from memory cells connected to the word line WL1 adjacent to the source select line SSL to memory cells connected to the word line WL16 adjacent to the drain select line DSL. In this case, the PLP operation controller 213 may control the nonvolatile storage area to dump data to memory cells connected to word lines included between the reference word line WL7 and the drain select line DSL.

In an embodiment, the backup block controller 211 shown in FIG. 2 may control the nonvolatile storage area to perform the pre-conditioning operation on memory cells connected to the word lines WL1 to WL6 included between the reference word line WL7 and the source select line SSL.

In an embodiment, the backup block controller 211 shown in FIG. 2 may control the nonvolatile storage area to perform the pre-conditioning operation on memory cells connected to a word line WL6 adjacent to the source select line SSL among word lines WL6 and WL8 adjacent to the reference word line WL7.

However, the present disclosure is not limited to such an embodiment. For example, the PLP operation controller 213 shown in FIG. 2 may control the nonvolatile storage area to perform the pre-conditioning operation on the memory cells connected to the word lines WL8 to WL16 included between the reference word line WL7 and the drain select line DSL and dump data to memory cells connected to the word lines WL1 to WL6 included between the reference word line WL7 and the source select line SSL.

Figure 6A:
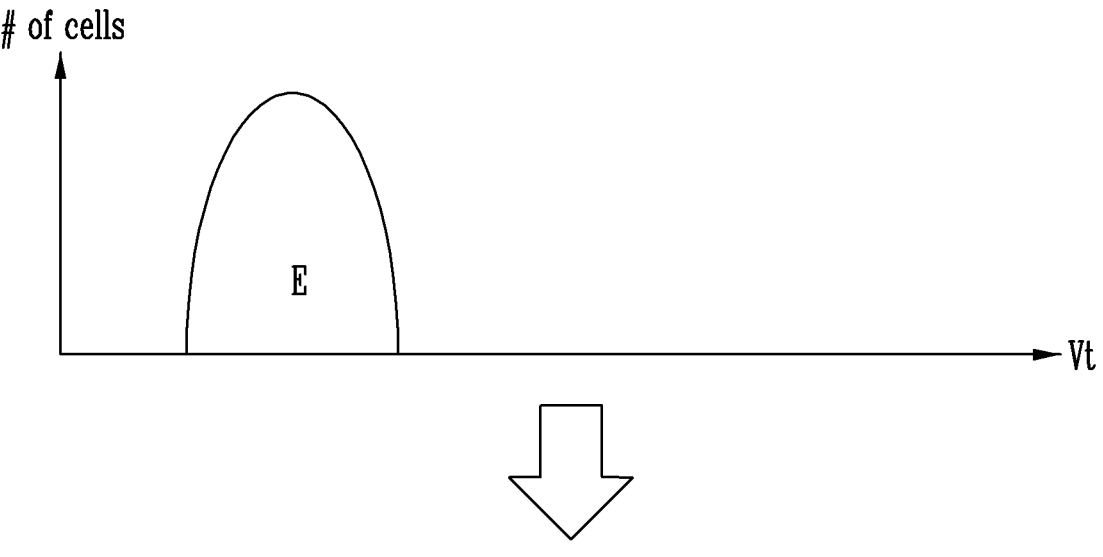
FIGS. 6A and 6B are diagram illustrating a threshold voltage distribution of a single level cell according to an embodiment of the present disclosure.
Figure 6B:
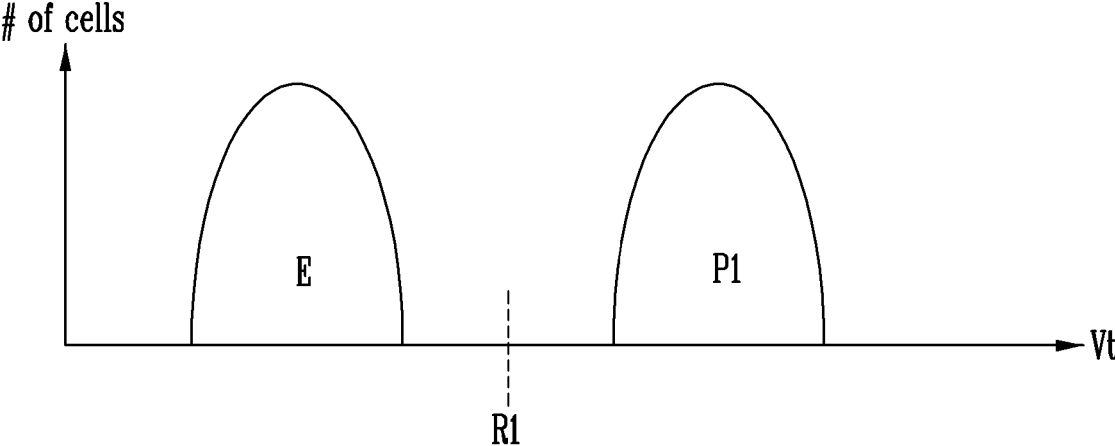

FIGS. 6A and 6B are diagram illustrating a threshold voltage distribution of a single level cell according to an embodiment of the present disclosure.

Referring to FIGS. 6A and 6B, a horizontal axis represents a threshold voltage of a memory cell, and a vertical axis represents the number of memory cells.

The memory device may perform the program operation in a word line unit. A plurality of memory cells connected to one word line may configure one physical page. A physical page may be a unit of the program operation or the read operation.

A memory device may program memory cells connected to a selected word line among a plurality of word lines according to data to be stored.

The selected memory cells, which are memory cells connected to the selected word line, may have a threshold voltage distribution corresponding to an erase state E as shown in FIG. 6A before the program operation is performed.

When a memory cell stores data corresponding to 1 bit, the memory cell may be programmed to have a threshold voltage corresponding to one of the erase state E or a first program state P1.

The erase state E may correspond to data '1', and the first program state P1 may correspond to data '0'. However, the data corresponding to the first program state P1 is an example, and the erase state E may correspond to data '0' and the first program state P1 may correspond to data '1'.

When the program operation is ended, the selected memory cells may have a threshold voltage corresponding to one the erase state E or the first program state P1 as shown in FIG. 6B. The memory device may read data stored in the selected memory cells by performing a read operation using a first read voltage R1 between the erase state E and the first program state P1.

FIG. 7 is a diagram illustrating pre-condition information according to an embodiment of the present disclosure.

Referring to FIG. 7, the pre-condition information may include the dummy data information and the address information.

The pre-condition information may be information required to perform the pre-conditioning operation. The pre-condition information may be stored in the nonvolatile storage area 240 shown in FIG. 2.

The dummy data information may be information on the dummy data to be stored in the target memory block among the plurality of backup memory blocks through the pre-conditioning operation. For convenience of description, the backup memory blocks shown in FIG. 2 are configured of the SLC.

The dummy data information may represent the dummy data to be stored in memory cells connected to one word line through the pre-conditioning operation. A size of the dummy data may be a page.

In an embodiment, the dummy data information may indicate data, each bit of which has a value of zero (0), to be stored in memory cells connected to one word line. As another example, the dummy data information may indicate data, each bit of which has a value of one (1), to be stored in memory cells connected to one word line. As still another example, the dummy data information may indicate data, each bit of which has a random value of either one (1) or zero (0), to be stored in memory cells connected to one word line.

However, the present disclosure is not limited to such an embodiment. For example, when the backup memory block shown in FIG. 2 is the MLC, the TLC, or the quad-level cell QLC, the dummy data information may indicate dummy data, two bits, four bits, or eight bits of which are to be stored in each of memory cells connected to one word line.

The address information may include address information of the target memory block and reference word line information of the reference word line selected from among the word lines coupled to the target memory block. The address information of the target memory block may include a physical block address of the target memory block. The reference word line information may indicate the reference word line requiring the lowest power to program data coupled thereto among a plurality of word lines coupled to the target memory block. A position of the reference word line may be different for each of the plurality of backup memory blocks.

Figure 8:
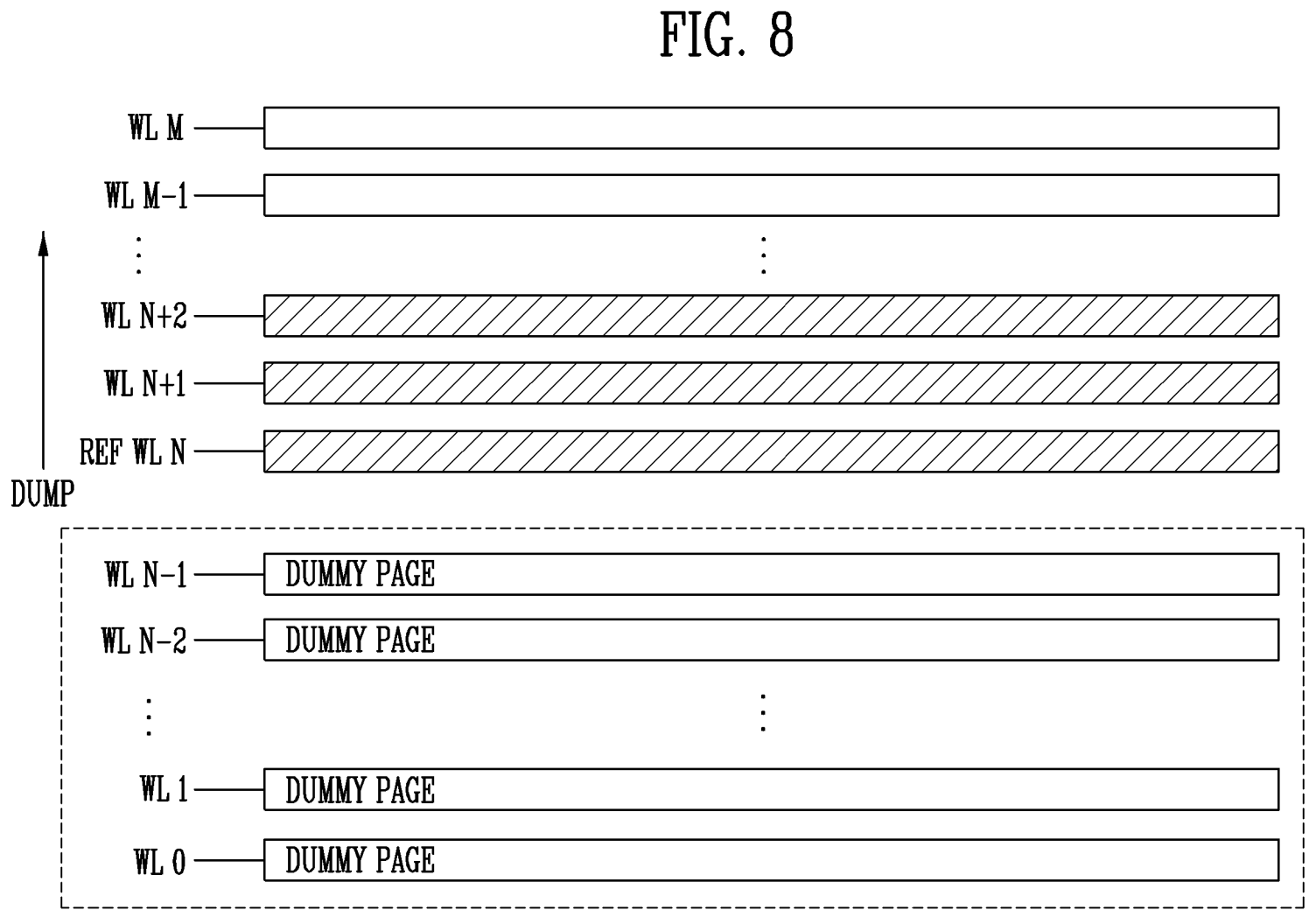

FIG. 8 is a diagram illustrating a pre-conditioning operation and a dump operation according to an embodiment of the present disclosure.

The backup block controller 211 shown in FIG. 2 may control the nonvolatile storage area to perform the pre-conditioning operation. For convenience of description, the target memory block is the backup memory block 1, and the reference word line corresponding to the backup memory block 1 is an N-th word line WL N.

Referring to FIG. 8, the backup memory block 1 which is the target memory block may include M+1 word lines WL 0 to WL M. Each of the word lines may include a plurality of memory cells (not shown). The plurality of memory cells connected to one word line may configure one page.

The backup block controller 211 shown in FIG. 2 may provide the read command CMD_READ for the pre-condition information to the nonvolatile storage area 240 when the power of the storage device is turned on. The nonvolatile storage area 240 may provide the pre-condition information stored in the backup area 241 to the pre-condition information storage 212 in response to the read command CMD_READ.

The backup block controller 211 may control the nonvolatile storage area 240 to perform the pre-conditioning operation based on the pre-condition information stored in the pre-condition information storage 212. When the SPO occurs, the backup block controller 211 may determine the target memory block on which the dump operation is to be performed. The backup block controller 211 may determine the reference word line, which is the word line requiring the lowest power to program data into the memory cells coupled thereto among the word lines coupled to the determined target memory block, based on the pre-condition information.

In an embodiment, the backup block controller 211 may determine the backup memory block 1 as the target memory block based on the address information among the plurality of backup memory blocks. The backup block controller 211 may determine the reference word line corresponding to the backup memory block 1 as the N-th word line WL N based on the address information.

The backup block controller 211 may determine the pre-conditioning operation mode.

As described above in the description of FIG. 2, the pre-conditioning operation mode may include the first operation mode in which the dummy data is programmed to the memory cells respectively connected to all word lines positioned below the reference word line and the second operation mode in which the dummy data is programmed to the memory cells connected to one word line positioned below the reference word line among the word lines adjacent to the reference word line.

Compared to the second operation mode, the dummy data is required to be programmed to memory cells connected to a larger number of word lines in the first operation mode. The backup block controller 211 may determine an operation mode based on available power of the storage device. A method of determining the operation mode by the backup block controller 211 is described later in the description of FIG. 10.

When the backup block controller 211 determines the pre-conditioning operation mode, the backup block controller 211 may determine word lines on which the pre-conditioning operation is to be performed, and determine dummy data to be stored in memory cells connected to word lines on which the pre-conditioning operation is to be performed, based on the dummy data information.

In an embodiment, the backup block controller 211 may determine the pre-conditioning operation mode as the first operation mode, and determine word lines on which the pre-conditioning operation is to be performed. That is, since the first operation mode is an operation mode in which the dummy data is programmed to the memory cells connected to the word lines positioned below the reference word line, the backup block controller 211 may perform the pre-conditioning operation on memory cells connected to the word lines WL 0 to WL N−1 positioned below the N-th word line WL N which is the reference word line.

In an embodiment, the backup block controller 211 may determine the dummy data to be stored in the memory cells coupled to word lines WL 0 to WL N−1 positioned at a lower portion. For example, the backup block controller 211 may determine the dummy data, each bit of which has a value of one (1), to be stored in memory cells connected to a 0-th word line WL 0. As another example, the backup block controller 211 may determine the dummy data, each bit of which has a random value of either one (1) or zero (0), to be stored in memory cells connected to a first word line WL 1. The lowest power may be required to program the dummy data in the memory cells coupled to each of the word lines WL 0 to WL N−1 positioned at a lower portion.

The backup block controller 211 may perform the pre-conditioning operation starting from a lower word line WL 0 positioned at the lowermost portion. The backup block controller 211 may provide the program command CMD_PROG to program the dummy data to memory cells connected to the 0-th word line WL 0, which is the lower word line positioned at the lowermost portion. The pre-conditioning operation may be sequentially performed from the lower word line WL 0 to an upper word line WL N−1. Therefore, each of memory cells connected to the 0-th word line WL 0 to an (N−1)-th word line WL N−1 may configure a dummy page in which the dummy data is stored.

The backup block controller 211 may perform the pre-conditioning operation while the storage device is booting.

After the pre-conditioning operation is completed, the SPO in which the power input to the storage device is suddenly cut off may occur. When the SPO occurs, the PLP operation controller 213 shown in FIG. 2 may control the nonvolatile storage area 240 to store or dump data from the volatile storage area 220 into the backup memory block.

In an embodiment, since the backup memory block 1 among the plurality of backup memory blocks is determined as the target memory block, when the SPO occurs, the PLP operation controller 213 may control the nonvolatile storage area 240 to perform the dump operation of storing or dumping the data from the volatile storage area 220 into the backup memory block 1.

Specifically, the PLP operation controller 213 may control the nonvolatile storage area 240 to store data in memory cells connected to the reference word line and memory cells respectively connected to upper word lines positioned above the reference word line.

In an embodiment, since each of the memory cells connected to the 0-th word line WL 0 to the (N−1)-th word line WL N−1 is programmed with the dummy data, the PLP operation controller 213 may control the nonvolatile storage area 240 to perform the dump operation from memory cells connected to an N-th word line WL N which is the reference word line in a direction of the upper portion line.

In an embodiment, the PLP operation controller 213 may control the nonvolatile storage area 240 to perform the dump operation of storing data in memory cells connected to the N-th word line WL N which is the reference word line to an (N+2)-th word line WL N+2.

Figure 9:
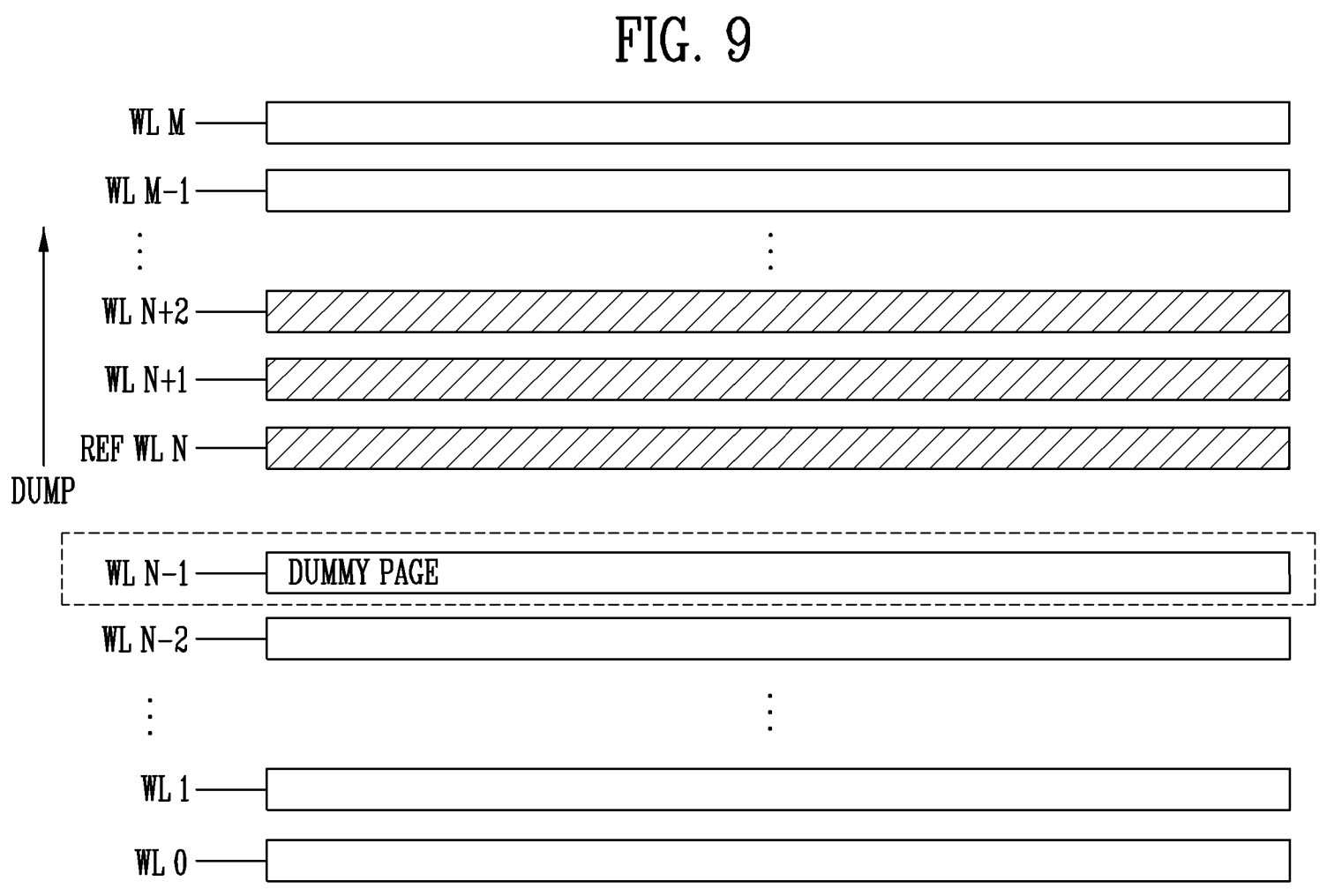

FIG. 9 is a diagram illustrating a pre-conditioning operation and a dump operation according to another embodiment of the present disclosure.

The backup block controller 211 shown in FIG. 2 may control the nonvolatile storage area to perform the pre-conditioning operation. For convenience of description, the target memory block is the backup memory block 1, and the reference word line corresponding to the backup memory block 1 is the N-th word line WLN.

Referring to FIG. 9, the backup memory block 1 which is the target memory block may include M+1 word lines WL 0 to WL M. Each of the word lines may include a plurality of memory cells (not shown). The plurality of memory cells connected to one word line may configure one page.

The backup block controller 211 shown in FIG. 2 may provide the read command CMD_READ for the pre-condition information to the nonvolatile storage area 240 when the power of the storage device is turned on. The nonvolatile storage area 240 may provide the pre-condition information stored in the backup area 241 to the pre-condition information storage 212 in response to the read command CMD_READ.

The backup block controller 211 may control the nonvolatile storage area 240 to perform the pre-conditioning operation based on the pre-condition information stored in the pre-condition information storage 212. When the SPO occurs, the backup block controller 211 may determine the target memory block on which the dump operation is to be performed. The backup block controller 211 may determine the reference word line, which is the word line requiring the lowest power to program data into the memory cells coupled thereto among the word lines coupled to the determined target memory block, based on the pre-condition information.

In an embodiment, the backup block controller 211 may determine the backup memory block 1 as the target memory block based on the address information among the plurality of backup memory blocks. The backup block controller 211 may determine the reference word line corresponding to the backup memory block 1 as the N-th word line WL N based on the address information.

The backup block controller 211 may determine the pre-conditioning operation mode.

As described above in the description of FIG. 2, the pre-conditioning operation mode may include the first operation mode in which the dummy data is programmed to the memory cells respectively connected to all word lines positioned below the reference word line and the second operation mode in which the dummy data is programmed to the memory cells connected to one word line positioned below the reference word line among the word lines adjacent to the reference word line.

In an embodiment, the backup block controller 211 may determine the pre-conditioning operation mode as the second operation mode for programming the dummy data to memory cells connected to one word line positioned below the reference word line among the word lines adjacent to the reference word line.

In an embodiment, the backup block controller 211 may determine the pre-conditioning operation mode as the second operation mode, and may determine a word line on which the pre-conditioning operation is to be performed. That is, since the second operation mode is an operation mode in which the dummy data is programmed to the memory cells connected to the word line positioned below the reference word line among the word lines adjacent to the reference word line, the backup block controller 211 may perform the pre-conditioning operation on the memory cells connected to the word line WL N-1 positioned at a lower portion among the word lines adjacent to the N-th word line WL N which is the reference word line.

In an embodiment, the backup block controller 211 may determine dummy data to be stored in the memory cells coupled to the word line WL N-1 positioned at the lower portion. For example, the backup block controller 211 may determine the dummy data, each bit of which has a value of one (1), to be stored in memory cells connected to the (N-1)-th word line WL N-1. As another example, the backup block controller 211 may determine the dummy data, each bit of which has a random value of either one (1) or zero (0), to be stored in memory cells connected to the (N-1)-th word line WL N-1. The lowest power may be required to program the dummy data in the memory cells coupled to the (N-1)-th word line WL N-1.

The memory cells connected to the (N-1)-th word line WL N-1 may configure a dummy page in which the dummy data is stored.

The backup block controller 211 may perform the pre-conditioning operation while the storage device is booting.

As described above with respect to FIG. 8, when the SPO occurs, the PLP operation controller 213 may control the nonvolatile storage area 240 to store data in the memory cells connected to the N-th word line WL N which is the reference word line and the memory cells respectively connected to the word lines positioned at the upper portion.

In an embodiment, since all memory cells connected to the (N-1)-th word line WL N-1 are programmed with the dummy data, the PLP operation controller 213 may control the nonvolatile memory area 240 to perform the dump operation from the memory cells connected to the N-th word line WL N which is the reference word line in a direction to the upper word line.

In an embodiment, the PLP operation controller 213 may control the nonvolatile storage area 240 to perform the dump operation of storing data in the memory cells connected to the N-th word line WL N which is the reference word line to the (N+2)-th word line WL N+2.

When the same data is programmed to all memory cells connected to each of a plurality of word lines coupled to a memory block included in a NAND flash memory device, a required program time and a current value flowing through the memory cell may be different according to a position of the word line. Therefore, according to the present disclosure, the PLP operation controller 213 may store data starting from memory cells connected to a word line having a short program time and a small current value flowing through the memory cell.

Figure 10:
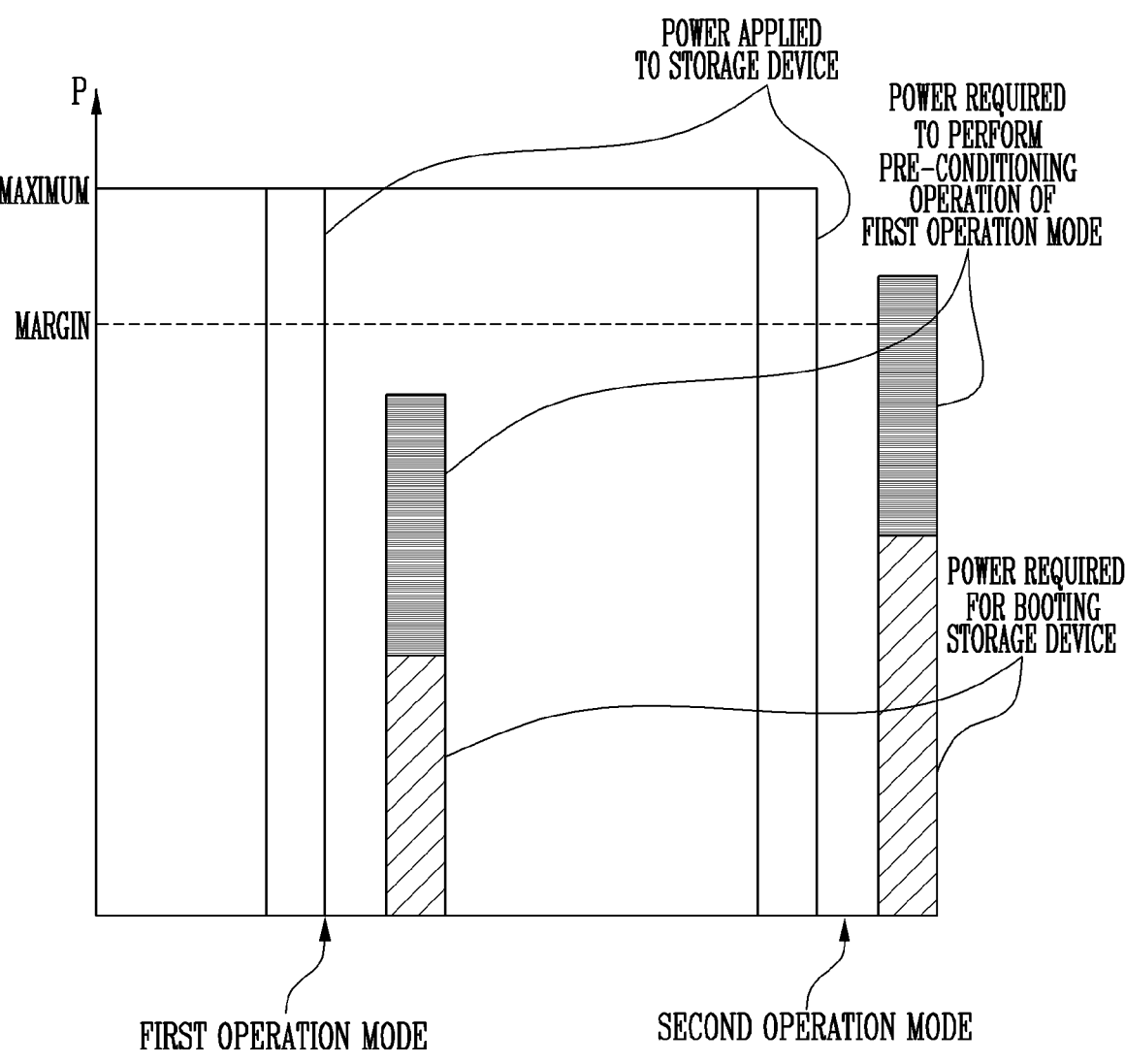
FIG. 10 is a diagram illustrating a method of determining a pre-conditioning operation mode according to an embodiment of the present disclosure.

FIG. 10 is a diagram illustrating a method of determining a pre-conditioning operation mode according to an embodiment of the present disclosure.

Referring to FIG. 10, a graph illustrating a relationship between the power applied to the storage device and power required to boot the storage device is shown.

When the power is applied to the storage device, the storage device may be turned on. The storage device may perform a booting operation of driving an operating system or the like required for driving the storage device using the applied power.

The pre-conditioning operation described above in the description of FIGS. 8 to 9 may be a background operation. In addition, as described above in the description of FIGS. 8 to 9, the pre-conditioning operation may be performed in parallel with the booting operation of the storage device.

The backup block controller 211 shown in FIG. 2 may determine the pre-conditioning operation mode based on the power applied to the storage device, the power required for booting the storage device, and power required to perform the pre-conditioning operation.

The backup block controller 211 may compare a value obtained by adding the power required for booting the storage device and the power required to perform the pre-conditioning operation with a margin value of the power applied to the storage device, and determine the pre-conditioning operation mode as the first operation mode when the value obtained by adding the power required for booting the storage device and the power required to perform the pre-conditioning operation is less than the margin value of the power applied to the storage device.

The backup block controller 211 may compare the value obtained by adding the power required for booting the storage device and the power required to perform the pre-conditioning operation with the margin value of the power applied to the storage device, and determine the pre-conditioning operation mode as the second operation mode when the value obtained by adding the power required for booting the storage device and the power required to perform the pre-conditioning operation is greater than or equal to the margin value of the power applied to the storage device.

The margin value of the power applied to the storage device may mean available power remaining after excluding minimum power required for driving the storage device among the power applied to the storage device.

In an embodiment, the backup block controller 211 performs the pre-conditioning operation according to the first operation mode. Since the dummy data is required to be programmed to memory cells connected to a larger number of word lines in the first operation mode compared to the second operation mode, a power consumption value according to the first operation mode may be greater than a power consumption value according to the second operation mode. Therefore, the backup block controller 211 may control the nonvolatile storage area 240 to perform the pre-conditioning operation according to the second operation mode when the pre-conditioning operation according to the first operation mode cannot be performed.

Figure 11:
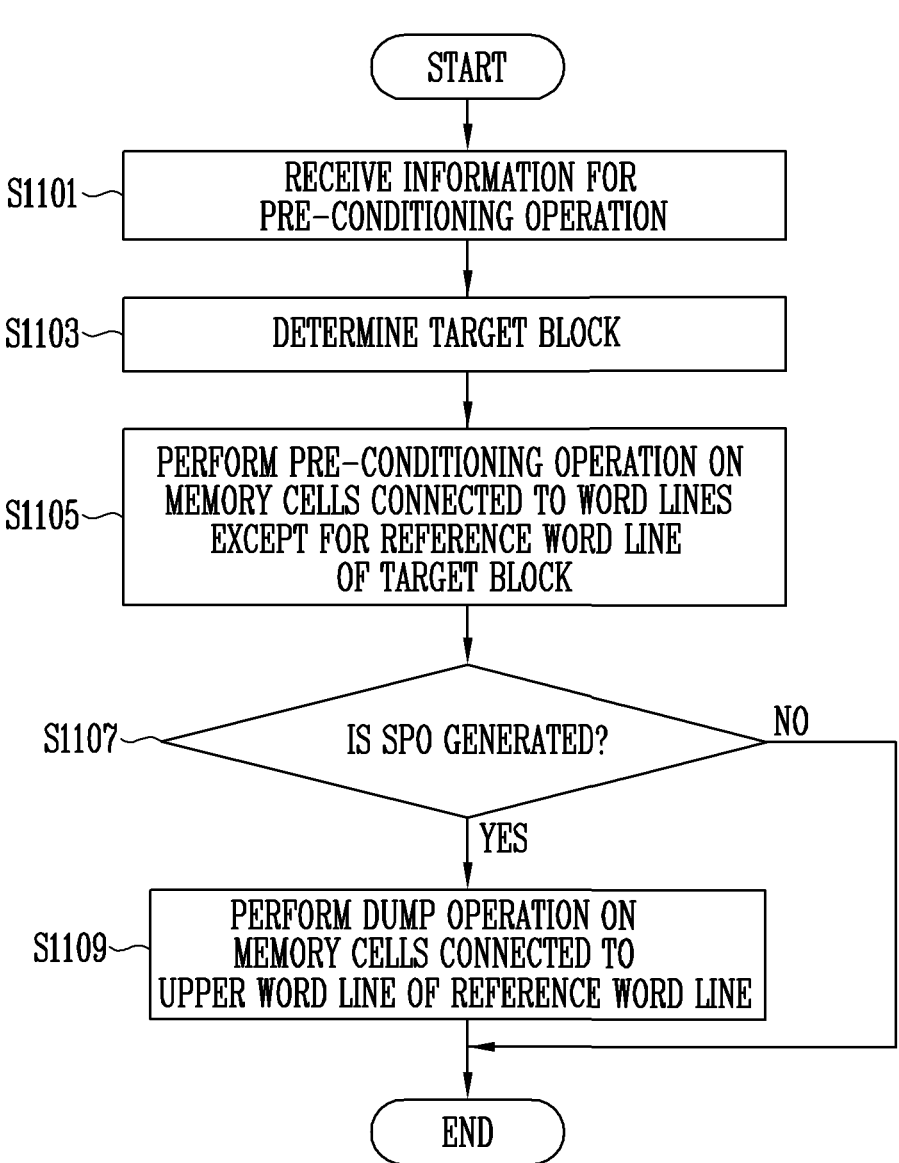
FIG. 11 is a flowchart for describing an operation of a controller according to an embodiment of the present disclosure.

FIG. 11 is a flowchart for describing an operation of a controller according to an embodiment of the present disclosure.

In operation S1101, the controller may receive information for the pre-conditioning operation. When the power of the storage device is turned on, the controller may provide the nonvolatile storage area with the read command CMD_READ for reading, from the nonvolatile storage area, the pre-condition information for the pre-conditioning operation. The controller may temporarily store, into the pre-condition information storage 212, the pre-condition information provided by the nonvolatile storage area.

In operation S1103, the controller may determine the target memory block on which the dump operation is to be performed. The controller may determine the target memory block based on the pre-condition information. The controller may determine the target memory block according to an order of addresses of the plurality of backup memory blocks.

In operation S1105, the controller may perform the pre-conditioning operation on the memory cells connected to the word lines except for the reference word line among the word lines coupled to the target memory block. The pre-conditioning operation may be performed during the booting process of the storage device. In addition, the pre-conditioning operation may be the background operation.

In operation S1107, the controller may check whether a SPO occurs.

In operation S1109, when the SPO occurs ("YES" in the operation S1107), the controller may perform the dump operation on the memory cells connected to the word lines positioned above the reference word line among the word lines coupled to the target memory block.

Figure 12:
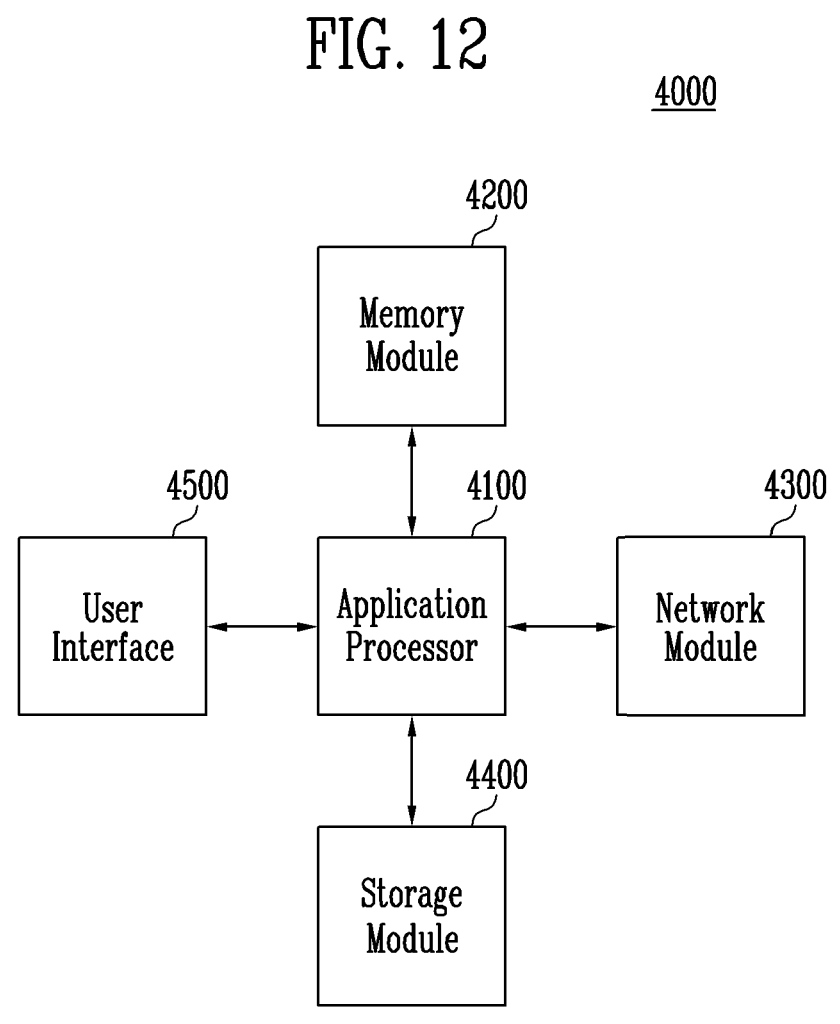

FIG. 12 is a diagram illustrating a user system 4000 to which a storage device according to an embodiment of the present disclosure is applied.

Referring to FIG. 12, the user system 4000 may include an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, WiMAX, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the nonvolatile storage area described with reference to FIG. 1. The storage module 4400 may operate identically to the storage device 200 described with reference to FIG. 1.

The user interface 4500 may include interfaces for inputting data, an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A storage device comprising:
a nonvolatile storage area including a plurality of backup memory blocks each including a plurality of memory cells respectively connected to a plurality of word lines; and
a controller configured to:
control the nonvolatile storage area to determine a target memory block in which data is to be stored among the plurality of backup memory blocks,
determine a reference word line among the plurality of word lines coupled to the target memory block, and
perform a pre-conditioning operation of programming dummy data to memory cells connected to at least one of remaining word lines except for the reference word line among the plurality of word lines coupled to the target memory block.

2. The storage device of claim 1, wherein the memory cells are single level cells (SLCs).

3. The storage device of claim 2, wherein the controller comprises:
a pre-condition information storage configured to store pre-condition information received from the nonvolatile storage area;
a backup block controller configured to determine word lines, on which the pre-conditioning operation is to be performed among the plurality of word lines coupled to the target memory block, and configured to control the nonvolatile storage area to perform the pre-conditioning operation on the determined word lines; and
a power loss protection (PLP) operation controller configured to control the nonvolatile storage area to perform a dump operation on memory cells connected to the reference word line and word lines included between a drain select line and the reference word line in response to a sudden power off.

4. The storage device of claim 3, wherein the backup block controller is further configured to determine the target memory block in an order of addresses of the plurality of backup memory blocks whenever power of the storage device is turned on.

5. The storage device of claim 3, wherein the pre-condition information includes:

address information including block address information of the backup memory blocks and information of reference word lines corresponding to the respective backup memory blocks, and dummy data information representing the dummy data having a size of a page within each of the backup memory blocks.

6. The storage device of claim 3, wherein the backup block controller determines, as a target of the pre-conditioning operation, word lines included between a source select line and the reference word line among the plurality of word lines coupled to the target memory block.

7. The storage device of claim 3, wherein the backup block controller determines, as a target of the pre-conditioning operation, a word line positioned close to a source select line and adjacent to the reference word line among the plurality of word lines coupled to the target memory block.

8. The storage device of claim 3, wherein the controller controls the nonvolatile storage area to perform the pre-conditioning operation on a word line positioned close to a source select line among word lines adjacent to the reference word line.

9. The storage device of claim 8, wherein the pre-conditioning operation is an operation of increasing a threshold voltage of all memory cells connected to the word line positioned close to the source select line.

10. The storage device of claim 1, wherein the controller performs the pre-conditioning operation during a booting process of the storage device.

11. The storage device of claim 10, wherein the pre-conditioning operation is a background operation.

12. The storage device of claim 1, wherein the reference word line is a word line requiring lowest power to program data to the memory cells coupled thereto, among the plurality of word lines coupled to the target memory block.

13. A storage device comprising:

a nonvolatile backup memory block including memory cells connected to each of a plurality of word lines; and a controller configured to perform, in response to a sudden power off, a dump operation on the memory cells connected to one of first and second word line groups divided with reference to a reference word line requiring lowest power to program data to the memory cells coupled thereto, among the plurality of word lines, wherein the dump operation stores the data from a volatile storage area into the memory cells of the nonvolatile backup memory block; and wherein the first and second word line groups correspond to word lines positioned below and above the reference word line, respectively.

14. The storage device of claim 13, wherein the one of the first and second word line groups includes word lines between the reference word line and a drain select line.

15. The storage device of claim 14, wherein the controller is further configured to perform an erase operation on the backup memory block when power of the storage device is recovered after performing the dump operation.

16. A method of operating a controller, the method comprising:

receiving pre-condition information;

determining, based on the pre-condition information, a target memory block on which a dump operation is to be performed;

performing a pre-conditioning operation on memory cells connected to word lines included between a source select line and a reference word line among word lines coupled to the target memory block; and performing, in response to a sudden power off, the dump operation on memory cells connected to word lines included between a drain select line and the reference word line among the word lines coupled to the target memory block.

17. The method of claim 16, wherein the pre-conditioning operation is performed during a booting process of a storage device.

18. The method of claim 17, wherein the pre-conditioning operation is an operation of programming dummy data to the memory cells connected to the word lines included between the source select line and the reference word line.

* * * * *